(12) United States Patent
Pizzato

(10) Patent No.: US 8,975,925 B2
(45) Date of Patent: Mar. 10, 2015

(54) ELECTRONIC SAFETY DEVICE FOR A PROTECTION BARRIER

(71) Applicant: Giuseppe Pizzato, Marostica (IT)

(72) Inventor: Giuseppe Pizzato, Marostica (IT)

(73) Assignee: Pizzato Elettrica S.R.L., Marostica (VI) (IT)

( * ) Notice: Subject to any disclaimer, the term of this patent is extended or adjusted under 35 U.S.C. 154(b) by 0 days.

(21) Appl. No.: 14/343,135

(22) PCT Filed: Dec. 28, 2012

(86) PCT No.: PCT/IB2012/057788
§ 371 (c)(1),
(2) Date: Mar. 6, 2014

(87) PCT Pub. No.: WO2013/098788
PCT Pub. Date: Jul. 4, 2013

(65) Prior Publication Data
US 2014/0300412 A1    Oct. 9, 2014

(30) Foreign Application Priority Data
Dec. 29, 2011    (IT) .................................. VI11A0342

(51) Int. Cl.
*G01R 23/02* (2006.01)
*H03K 17/00* (2006.01)
*H03K 17/95* (2006.01)
*H03K 17/60* (2006.01)

(52) U.S. Cl.
CPC ............ *H03K 17/00* (2013.01); *H03K 17/9502* (2013.01); *H03K 17/60* (2013.01); *H03K 2217/958* (2013.01)

USPC ................ 327/47; 327/49; 235/420; 235/430

(58) Field of Classification Search
USPC ........... 327/39–40, 47–49; 235/454, 420, 430
See application file for complete search history.

(56) References Cited

U.S. PATENT DOCUMENTS

| 5,467,082 | A | 11/1995 | Sanderson |
| 5,589,821 | A | 12/1996 | Sallen et al. |
| 8,844,830 | B2 * | 9/2014 | Smith ........................... 235/492 |
| 2006/0220846 | A1 | 10/2006 | Stratmann |
| 2014/0263636 | A1 * | 9/2014 | Jones et al. ................... 235/385 |

* cited by examiner

*Primary Examiner* — An Luu
(74) *Attorney, Agent, or Firm* — Themis Law

(57) ABSTRACT

An electronic safety device for a protection barrier includes a transponder, a transceiver device for receiving a return signal from the transponder, the transponder being movable with respect to the transceiver and adapted to be placed at a current distance, an electric circuit which is switched when the distance is lower or higher than a reference distance and a control and switching system. The transceiver device processes the return signal to generate a control signal with an electric parameter variable in function of the distance. The control signal is a periodic signal with a frequency and has a first spectrum with a middle interval and a second spectrum with lateral intervals shifted with respect the middle interval when the distance is higher than the reference distance, the parameter being associated to a frequency value that comprises either into the middle interval or into one of the lateral intervals.

13 Claims, 4 Drawing Sheets

ELECTRONIC SAFETY DEVICE FOR A PROTECTION BARRIER

FIELD OF THE INVENTION

The present invention generally finds application in the field of electric safety devices and particularly relates to an electronic safety device for a protection barrier.

BACKGROUND ART

A number of electronic safety devices are known, which are adapted for use with protection barriers for industrial plants, and are designed to open an electric circuit in case of emergency or hazard for a user.

Particularly, such known devices comprise a first portion associated with a stationary part of the barrier and a second portion associated with a moving part of the barrier, e.g. a protection member, a door or the like, to monitor the opening and closing states thereof and stop the operation of the plant if the barrier is open.

Namely, the device comprises one or more switches, which are designed to change their own electrical state from closed to open or vice versa, in function of the distance between the stationary portion and the moving portion.

For instance, the switch may be electrically closed only if the two parts are at very little or no distance from each other.

A particularly common type of such safety devices uses a RFID transponder associated with the moving portion and is adapted to communicate with a transceiver device anchored to the stationary part and having a reading head which is adapted to receive an identification signal sent by the transponder and compare it with a code stored therein.

Thus, when both codes match, the device closes the circuit thereby allowing operation of the plant.

This configuration prevents any accidental or fraudulent actuation, because communication between the transceiver device and a well-defined transponder is needed for the circuit to be closed.

Nevertheless, these solutions also have drawbacks, as any interference might cause reading errors and resulting failures.

For overcome such drawbacks, forms of such safety devices have been developed, with control circuits designed to prevent any malfunctioning.

For instance, EP0968567 discloses an electronic safety device of the type as described hereinbefore, in which the microprocessor control circuits designed to check whether the identification code transmitted by the transponder matches the code stored in the reading head are provided in duplicate.

Particularly, each control circuit is designed to individually check the received signal and compare the received identification code with the stored code.

The actuation signal will be only generated if the received identification code matches the stored code for both control circuits.

While this device provides a higher safety degree, due to the redundancy of the control circuits, it still suffers from certain drawbacks, one of which is the apparent circuit complexity required by the duplication of all the control elements.

Furthermore, the distance between the transponder and the reading head is assessed by detecting the amplitude of the received return signal, which may easily change due to spurious interferences in the area around the device.

Furthermore, the control circuit directly operates on the waveform of the received signal, and this might introduce distortions that might significantly change the amplitude value, particularly in case of malfunctioning.

A further drawback of this solution is that the received signal is poorly immune to background noise and such signal can be only properly detected by providing the control circuit with highly effective and relatively expensive filters, which must be further centered in a particularly accurate manner around the signal transmission frequency, with poor adaptability of the filtering features to the various types of commercially available transponders.

Furthermore, the provision of a device for monitoring the amplitude of the received signals and the checking elements further reduces the possibility of using various types of RFID transponders, with different transmission frequencies.

Finally, the device for monitoring the level of the received signal is connected downstream from the antenna of the reading head and may be affected by the temperature of the outside environment in which the electronic safety device is installed.

DISCLOSURE OF THE INVENTION

The object of the present invention is to overcome the above drawbacks, by providing an electronic safety device for protection barriers that is highly efficient and relatively cost-effective.

A particular object is to provide an electronic safety device for protection barriers that is difficult to tamper and ensures a high safety degree.

A further object of the present invention is to provide an electronic safety device for protection barriers that can assess the distance between the moving part and the stationary part in a particularly accurate manner.

Another object of the present invention is to provide an electronic safety device for protection barriers that is highly immune to noise and spurious interferences in the environment.

A further object of the present invention is to provide an electronic safety device for protection barriers that uses a smaller number of components and requires relatively low manufacturing costs.

Yet another object of the present invention is to provide an electronic safety device for protection barriers that ensures high versatility and can use various types of RFID transponders.

These and other objects, as better explained hereafter, are fulfilled by an electronic safety device as defined in claim 1.

Advantageous embodiments of the invention are obtained in accordance with the dependent claims.

BRIEF DESCRIPTION OF THE DRAWINGS

Further features and advantages of the invention will be more apparent upon reading of the detailed description of a preferred, non-exclusive embodiment of an electronic safety device for a protection barrier according to the invention, which is described as a non-limiting example with the help of the annexed drawings, in which.

DETAILED DESCRIPTION OF A PREFERRED EMBODIMENT

Figure 1:
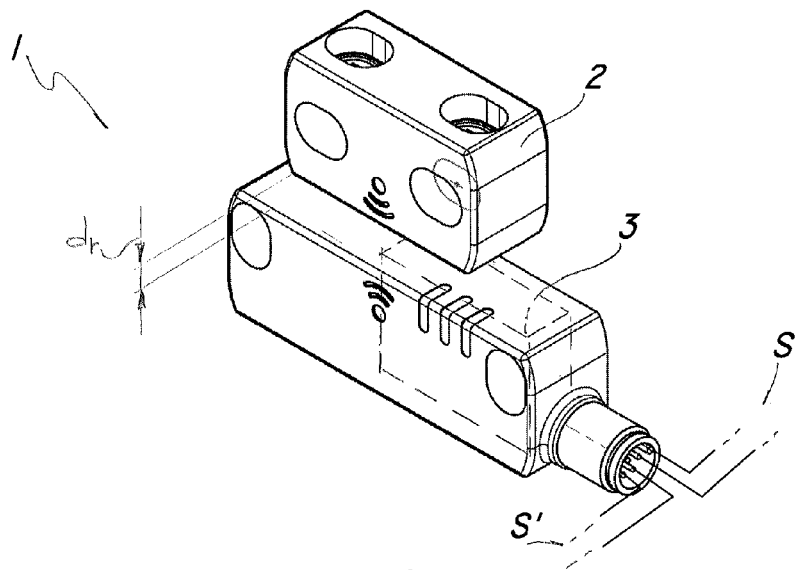
FIG. 1 is a perspective view of a first embodiment of a safety device of the invention.
Figure 2:
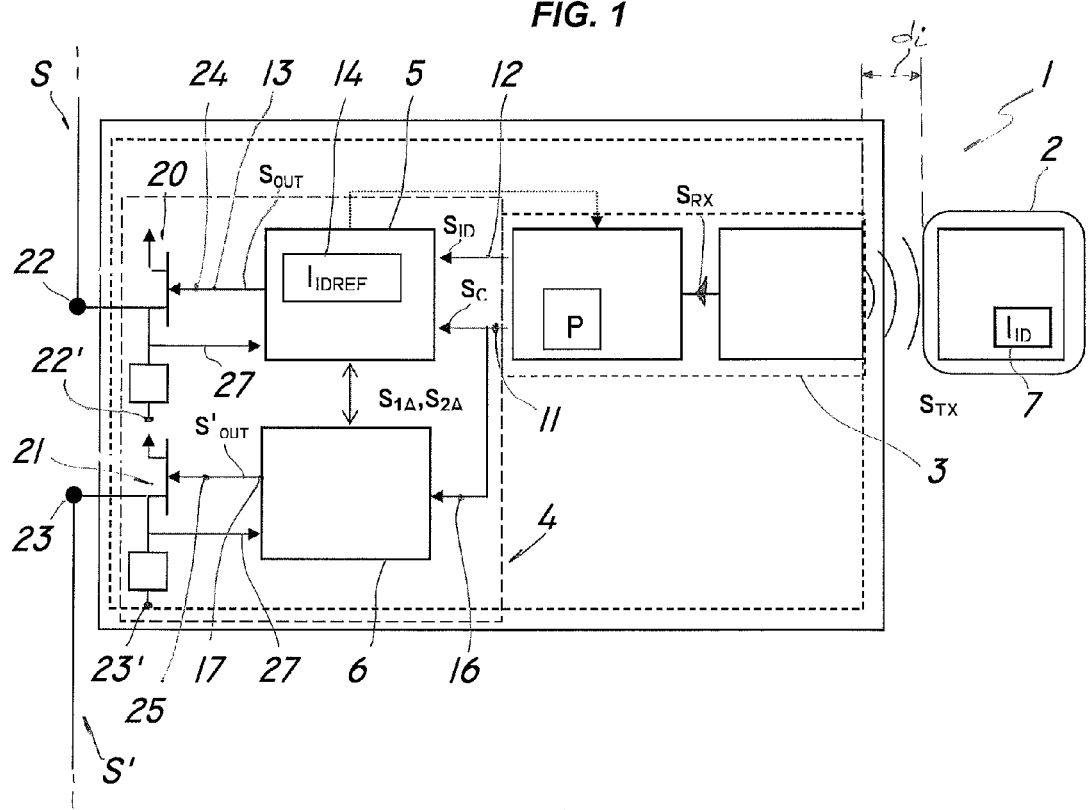
FIG. 2 is a simplified block diagram of the switch of FIG. 1.

Referring to the above figures, an electronic safety device for a protection barrier, generally designated by numeral 1, may be mounted to a protection barrier or a working area, not shown and known per se, having one or more safety electric circuits S, S'.

Particularly, the barrier may include a fixed working area delimiting frame and a movable part, which is adapted to allow controlled access of an operator therein.

The device 1 may be electrically connected to one or more warning, emergency or alarm safety circuits S, S' to trigger the latter at the same time as the moving part of the protection member is opened or closed, thereby ensuring the requested safety.

An electronic safety device 1 for a protection barrier of the invention comprises a transponder 2 that is designed to be anchored to the movable part of the barrier in which an identification code $I_{ID}$ is stored.

Furthermore, the device comprises a transceiver device 3 designed to be anchored to the fixed part of the barrier and is adapted to transmit a radio frequency excitation signal $S_{TX}$ to the transponder 2 and to receive therefrom a return signal $S_{RX}$ associated with the identification code $I_{ID}$.

Furthermore, control and switching means 4 are provided, which are connected to the transceiver device 3 and have a master electronic circuit 5 connected to the transceiver device 3 and adapted to retrieve and process the identification code $I_{ID}$ extracted from the signal $S_{RX}$ and to generate a first output signal $S_{OUT}$ for switching at least one electric circuit S, S' associated with the barrier.

According to a peculiar feature of the invention, the transceiver device 3 is adapted to process the return signal $S_{RX}$ to generate a control signal $S_C$ having at least one electric parameter P that changes with the current distance $d_i$ thereof from the transponder 2.

The transceiver device 3 may be designed to generate a control signal $S_C$ whose electric parameters are different from those of the return signal $S_{RX}$. Such parameters may be a function of the instantaneous values of the electric parameters of the return signal $S_{RX}$ transmitted by the transponder 2.

Conveniently, the control and switching means 4 may include a slave electronic circuit 6 which is adapted to receive the control signal $S_C$ and vary the first output signal $S_{OUT}$ as a function of it. Thus, the first output signal $S_{OUT}$ may actuate the control and switching means 4 to open or close the safety electric circuit S, S', when the control signal $S_C$ has an electric parameter P associated with a distance $d_i$ between the transceiver device 3 and the transponder 2 that is lower or higher than a predetermined reference distance $d_r$. In an exemplary, non-limiting configuration of the invention, as shown in the figures, the device 1 may be designed to close two safety electric circuits S, S' when the distance $d_i$ between the transceiver device 3 and the transponder 2 is lower or equal to the reference distance $d_r$.

Conversely, when such distance $d_i$ is higher than the reference distance $d_r$, the device 1 may open the safety electric circuits S, S', thereby warning that the moving part of the protection member has been opened.

Conveniently, the transponder 2 may include an electronic tag 7 containing the identification code and adapted to be self-powered with the excitation signal $S_{TX}$ transmitted by the transceiver device 3.

Particularly, the excitation signal may be of the radio-frequency type, having a substantially constant frequency, corresponding to the operation frequency of the electronic tag 7.

For instance, the transceiver device 3 may generate a substantially periodic excitation signal whose frequency is substantially 125 kHz, allowing self-powering of a variety of commercially available transponders 2.

The transceiver device 3 may comprise an antenna 8, for transmitting the excitation signal $S_{TX}$ and receiving the return signal $S_{RX}$.

Furthermore, the return signal may have the same frequency as the excitation signal or a different frequency.

Conveniently, the control signal generated by the transceiver device 3 may be of periodic type, with a repetition frequency $f_C$ that is substantially constant with time.

Figure 3:
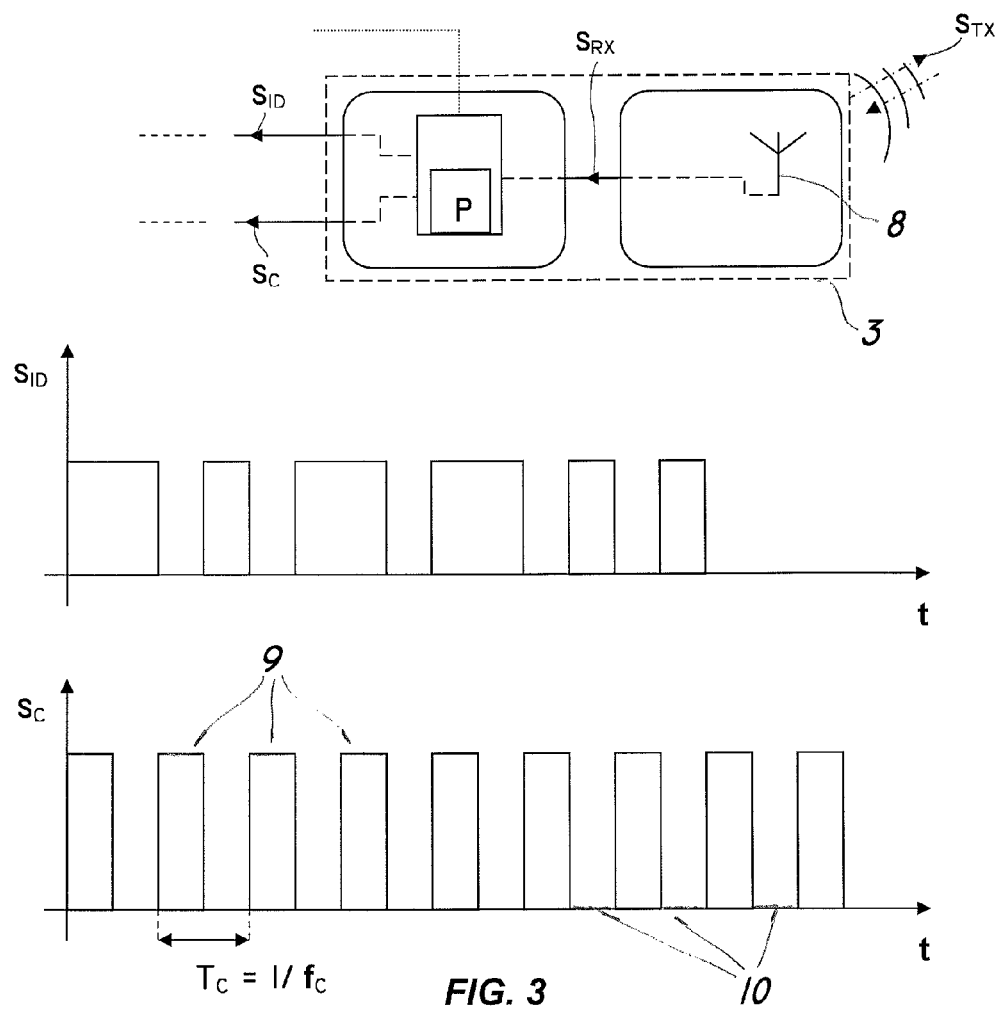
FIG. 3 is a view of a first detail of the diagram of FIG. 1, including the time charts of two signals.

As better shown in FIG. 3, the control signal $S_C$ may be substantially of the square wave type with a repetition frequency $f_C$ of 2 kHz.

In a particularly advantageous aspect of the invention, such control signal may be used as a synchronism signal for the master electronic circuit 5 located downstream from the transceiver device 3.

The transceiver device 3 may be designed to use the return signal $S_{RX}$ to generate an identification signal $S_{ID}$ containing the identification code $I_{ID}$ of the transponder 2.

Thus, the transceiver device 3 may provide the master electronic circuit 5 with identification signal $S_{ID}$ and the control signal $S_C$, both shown in FIG. 3.

The latter may be used both to determine the instantaneous distance $d_i$ between the transceiver device 3 and the transponder 2 and to synchronize reception and processing of the identification signal $S_{ID}$.

Conveniently, the slave electronic circuit 6 may be adapted to determine the electronic parameter P by frequency analysis of the periodic control signal $S_C$.

Indeed, any change of the distance between the transceiver device 3 and the transponder 2 may cause an instantaneous change of the ratio r of the duration of the high level portion 9 of the control signal to the duration of the low level portion 10 thereof, and such ratio r may change within one or more repetition periods $T_C$.

The instantaneous change of the ratio r may cause a change in the frequency spectrum of the control signal $S_C$ with respect to the spectrum of a common square wave periodic signal.

Figure 4:
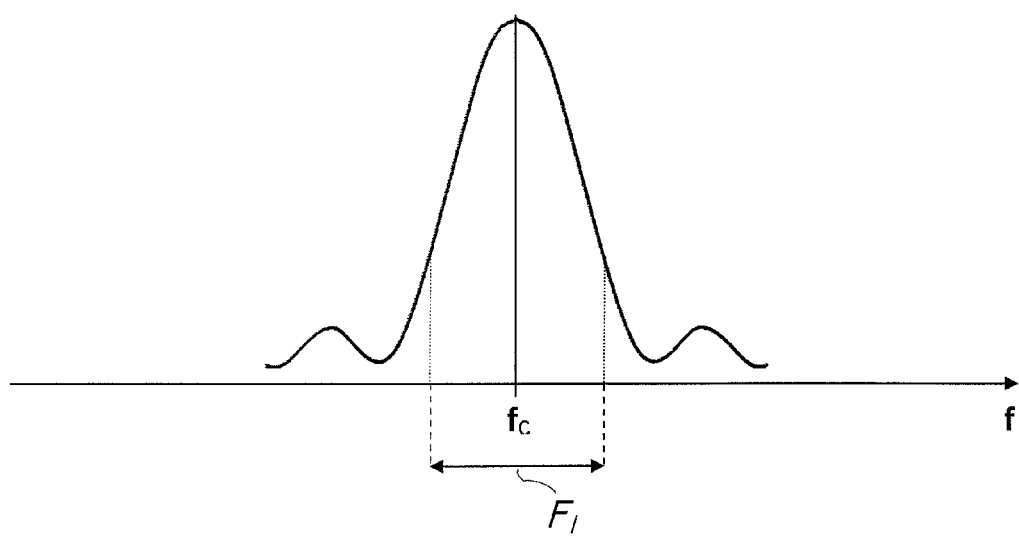
FIG. 4 is a first representation of the frequency spectrum of a signal of FIG. 3.

If the transceiver device 3 is at a distance $d_i$ from the transponder 2 that is lower than the reference distance $d_r$, the control signal $S_C$ will have a first frequency spectrum, e.g. as shown in FIG. 4, whose distribution is substantially comparable to a Gaussian curve having a main power peak centered at the repetition frequency $f_C$.

Figure 5:
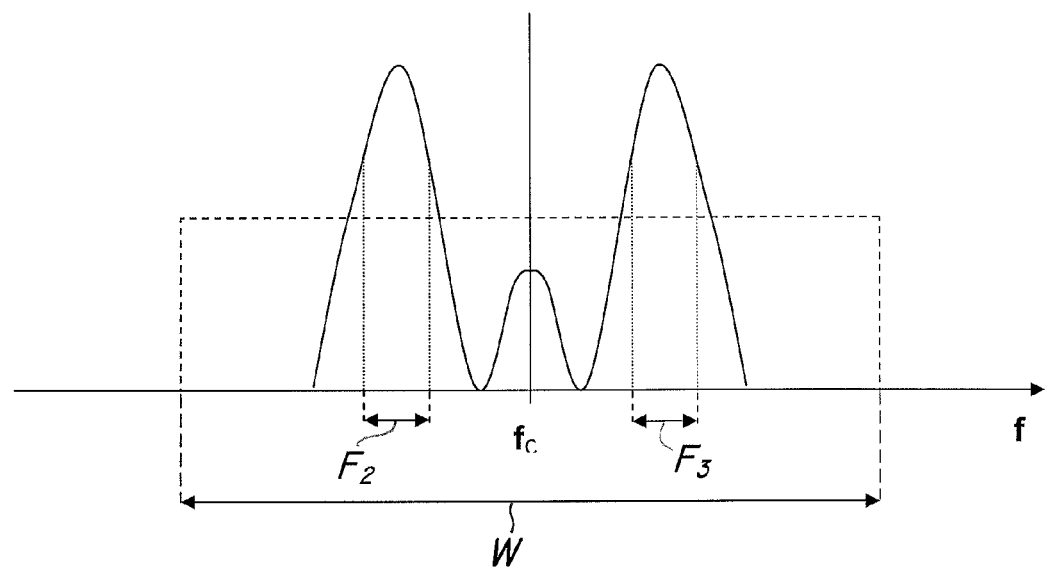
FIG. 5 is a second representation of the frequency spectrum of a signal of FIG. 3.

Conversely, if the transceiver device 3 is at a distance $d_i$ from the transponder 2 that is higher than the reference distance $d_r$, the control signal $S_C$ will have a second frequency spectrum, e.g. as shown in FIG. 5, whose energy distribution has a secondary peak centered at the repetition frequency $f_C$ and two substantially symmetrical main peaks whose frequencies are shifted from the repetition frequency $f_C$.

In the former case, a first middle frequency interval $F_1$ may be defined, which is centered at the repetition frequency $f_C$, corresponding to the highest energy of the main peak.

However, in the second case, two lateral frequency intervals $F_2$, $F_3$, which are shifted relative to the first interval $F_1$, each corresponding to the highest energy of the corresponding symmetrical peak.

Thus, the slave electronic circuit 6 may be designed to associate the electric parameter P with a quantity proportional to the frequency that corresponds to the highest energy peak as detected by analysis of the frequency spectrum of the control signal $S_C$.

If the distance between the transceiver device 3 and the transponder 2 is lower or equal to the reference distance, the electric parameter P will be associated with a frequency value comprised into the middle interval $F_1$, whereas if such distance $d_t$ is higher than the reference distance $d_r$, the electric parameter P will be associated with a frequency value comprised into one of the lateral intervals $F_2$, $F_3$.

Nevertheless, it should be noted that while the control signal has a ratio r that changes with distance, it may still remain of the periodic type, with a repetition frequency $f_C$ subjected to minor changes around a predetermined average value.

Figure 6:
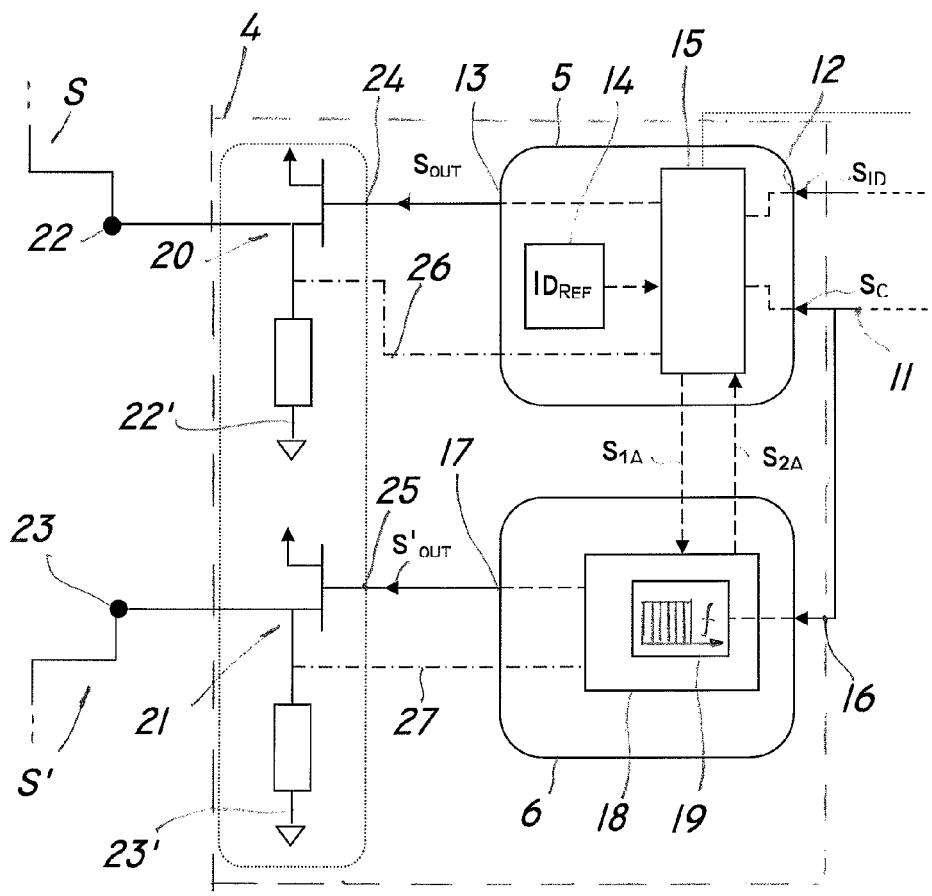
FIG. 6 is view of a second detail of the diagram of FIG. 2.

Conveniently, the master electronic circuit 5, as shown in FIG. 6, comprises at least one first 11 and one second 12 inputs, which are connected to the transceiver device 3 to receive the control signal $S_C$ and the identification signal $S_{ID}$ respectively, and at least one first output 13 for the first output signal $S_{OUT}$.

Furthermore, the master electronic circuit 5 may comprise a memory section 14 for storing at least one reference code $I_{DREF}$ of one or more transponders 2 for identification by the switch 1.

Conveniently, the master processing unit 5 may include a first microprocessor processing unit 15 adapted to draw the stored reference code $I_{DREF}$ from the memory section 14 and comparing it with the identification code at the second input 12. The first microprocessor 15 may be designed to detect the control signal $S_C$ at the first input 11 of the master processing unit to use it as a synchronism signal.

In this case, using the synchronization provided by the control signal $S_C$, the first processor 15 may detect the match between the identification code $I_{ID}$ associated with the identification signal $S_{ID}$ at the second input 12 and one of the stored reference codes $I_{DREF}$.

Conveniently, the first processor 15 may send a first activation signal $S_{1A}$ to the slave electronic circuit 6 in response to the comparison performed by the processor between the identification code $I_{ID}$, associated with the identification signal $S_{ID}$, and one or more stored reference codes $I_{DREF}$.

Suitably, the slave electronic circuit 6 may comprise at least one third input 16 connected to the transceiver device 3 to receive the control signal $S_C$ therefrom and at least one second output 17 for a second output signal $S_{OUT}'$.

Furthermore, the slave electronic circuit 6 may comprise a second processor 18 having a programmable section 19 adapted to define digital filtering means for analyzing the frequency spectrum of the control signal $S_C$ and generating the electric parameter P.

The digital filtering means may be designed to detect the frequency corresponding to the energy peak of the spectrum by associating it with the electric parameter P of the control signal $S_C$.

Conveniently, the digital filtering means may be centered at the repetition frequency $f_C$ of the control signal $S_C$ and may have a fixed or variable bandwidth W, as better shown in FIG. 5.

The second microprocessor 18 may generate a second activation signal $S_{2A}$ in response to the value associated with the electric parameter P of the control signal $S_C$ and may send such second activation signal $S_{2A}$ to the master electronic circuit 5.

Advantageously, the master electronic circuit 5 and the slave electronic circuit 6 are adapted to generate corresponding first $S_{OUT}$ and second $S'_{OUT}$ output signals as a function of the second $S_{2A}$.

Indeed, the master electronic circuit 5 may be designed to generate a corresponding first output signal $S_{OUT}$ according to both the processing performed by the first processor 15 and the second activation signal $S_{2A}$.

On the other hand, the slave electronic circuit 6 may be designed to generate a corresponding second output signal $S'_{OUT}$ according to both the processing performed by the second processor 18 and the first activation signal $S_{1A}$.

Conveniently, the switching means 4 may include at least one first 20 and one second 21 semiconductor switches, and each may have output terminals 22, 22'; 23, 23' adapted to be connected to one or more safety electric circuits S, S' and an input terminal 24, 25 connected to the corresponding first 13 and second 17 outputs of the master 5 and slave 6 electronic circuits, to receive the first $S_{OUT}$ and second $S'_{OUT}$ output signals therefrom.

As better shown in FIG. 6, the first 20 and second 21 semiconductor switches may consist of a pair of power transistors, e.g. of the IGBT type or the like, whose input is controlled by the first $S_{OUT}$ or the second $S'_{OUT}$ output signal generated by the corresponding master 5 or slave 6 electronic circuits.

In the illustrated configuration, each master 5 or slave 6 electronic circuit may be connected to at least one individual transistor 20, 21 and may be designed to send corresponding first $S_{OUT}$ and second output signals $S'_{OUT}$ to the input 24, 25 thereof, which output signals are synchronized and independently generated to increase safety in switching of the safety circuits S and S'.

Conveniently, each master 5 and slave 6 electronic circuit may include a respective feedback circuit 26, 27 associated with the corresponding semiconductor switch element 20, 21 and adapted to control operation thereof.

The first 15 and second 18 processors may be designed to generate corresponding first $S_{OUT}$ and second output signals $S'_{OUT}$ for stably opening and closing the transistor when the corresponding feedback circuit indicates an anomaly therein.

Figure 7:
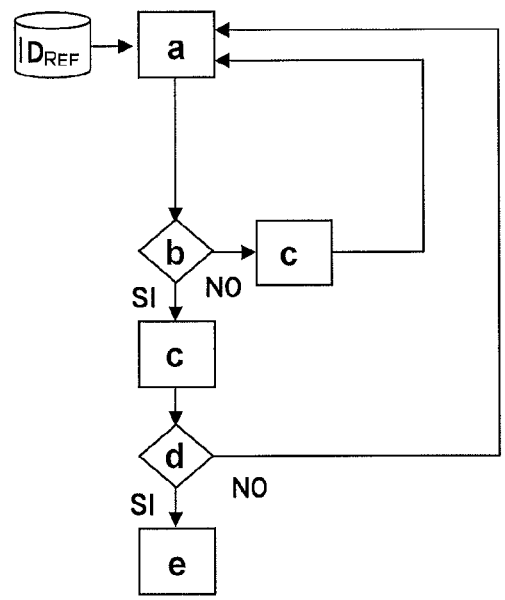
FIG. 7 is a flow chart of a third detail of FIG. 5.

In a further aspect, the invention relates to a processing method for the master electronic circuit 5, as shown in FIG. 7, which comprises a first step of a) retrieving a reference code $I_{DREF}$ stored in the memory portion 14 and a step of b) comparing such reference code $I_{DREF}$ with the identification code $I_{ID}$ associated with the identification signal $S_{ID}$ at the second input 12.

A step is further provided of c) generating and sending the first activation signal $S_{1A}$ to the slave electronic circuit 6, which signal is generated in response to the result of the comparison performed during the step b).

If the comparison step b) has a negative result, the master electronic circuit 5 will get ready to carry out a later step of a) retrieving a reference code $I_{DREF}$ and will indicate this state to the slave electronic circuit 6 with an appropriate activation signal $S_{1A}$ generated and sent during the step c).

Conversely, if the comparison step b) has a positive result, then the master electronic circuit 5 will indicate this condition to the slave electronic circuit 6 with a first activation signal $S_{1A}$ and will carry out a step d) of retrieving the second activation signal $S_{2A}$ transmitted by the slave electronic circuit 6 in response to reception of the first activation signal $S_{1A}$.

If the step d) detects a positive second activation signal $S_{2A}$, indicating that the distance between the transceiver device 3 and the transponder 2 is lower or equal to the reference distance, then the master electronic circuit 5 will carry out a step of e) generating and sending the first output signal $S_{OUT}$ to the control and switch means 4.

Conversely, if the step d) detects a negative second activation signal $S_{2A}$, indicating that the distance $d_i$ between the transceiver device 3 and the transponder 2 is higher than to the reference distance $d_r$, the master electronic circuit 5 will get ready to carry out a later step of a) retrieving a reference code $I_{DREF}$.

Figure 8:
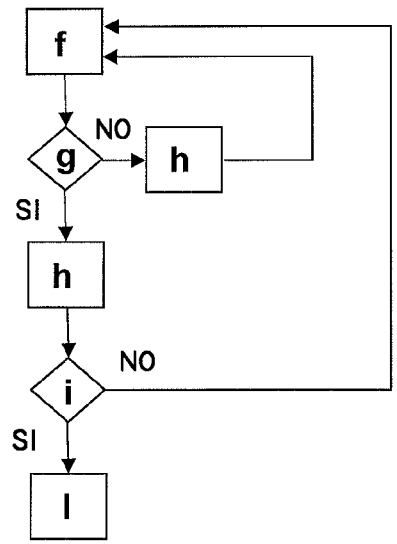
FIG. 8 is a flow chart of a fourth detail of FIG. 5.

Likewise, as better shown in FIG. 8, a processing method may be described, which is associated with the slave electronic circuit 6.

Such method comprises a step f) of determining the variable electric parameter P associated with the frequency that corresponds to the main energy peak of the frequency peak of the control signal $S_C$.

Conveniently, there will be a step g) of comparing such electric parameter P with a value corresponding to the reference distance $d_r$, followed by a step h) of generating and sending the second activation signal $S_{2A}$ to the master electronic circuit 5, as a function of the value assumed by the parameter P.

If the electric parameter P is associated with a distance $d_i$ between the transceiver device 3 and the transponder 2 that is lower than or equal to the reference distance $d_r$, then there will be a step i) of detecting the first activation signal $S_{1A}$ transmitted by the master electronic circuit 5, and if the such signal is a positive signal, there will be a step l) of generating and sending the second output signal $S'_{OUT}$ to the control and switch means 4.

Otherwise, if the step i) detects a negative first activation signal $S_{1A}$, then the slave electronic circuit will get ready to perform a new step f) of determining the electric parameter P.

The above disclosure clearly shows that the invention fulfills the intended objects and particularly the object of providing an electronic safety device for a protection barrier that ensures high safety and has a compact size, and that can be used in a variety of different safety electronic circuits.

The device of the invention is susceptible to a number of changes and variants, within the inventive concept disclosed in the appended claims. All the details thereof may be replaced by other technically equivalent parts, and the materials may vary depending on different needs, without departure from the scope of the invention.

While the safety electronic device for a protection barrier has been described with particular reference to the accompanying figures, the numerals referred to in the disclosure and claims are only used for the sake of a better intelligibility of the invention and shall not be intended to limit the claimed scope in any manner.

What is claimed is:

1. An electronic safety device for a protection barrier, wherein the barrier comprises a fixed part and a movable part, the electronic safety device comprising:
    a transponder (2) designed to be anchored to the movable part of the barrier and having an identification code ($I_{ID}$) stored therein;
    a transceiver device (3) anchorable to the fixed part of the barrier and adapted to receive from said transponder (2) a return signal ($S_{RX}$) associated to said identification code ($I_{ID}$);
    said transponder (2) being movable with respect said transceiver device (3) and adapted to be positioned to a current distance ($d_i$) with respect the transceiver device;
    at least one electric circuit (S, S') associated to the barrier and adapted to be switched when said current distance ($d_i$) is lower or higher to a predetermined reference distance ($d_r$); and
    a control and switching system (4) having a master electronic circuit (5) connected to said transceiver device (3) and configured to process said return signal ($S_{RX}$) and to generate a first output signal ($S_{OUT}$) in response to said identification code ($I_{ID}$) for a switching of said at least one electric circuit (S, S');
    wherein said transceiver device (3) is adapted to process said return signal ($S_{RX}$) for generating a control signal ($S_C$) having an electric parameter (P) variable in function of the current distance ($d_i$); and
    wherein said control signal ($S_C$) is a periodic signal with a predetermined repetition frequency ($f_C$), having a first frequency spectrum with a middle interval ($F_1$) centered with respect to said repetition frequency ($f_C$) when said current distance ($d_i$) is lower than or equal to said reference distance ($d_r$), and having a second frequency spectrum with lateral intervals ($F_2$, $F_3$) shifted with respect to said middle interval ($F_1$) when said current distance ($d_i$) is higher than said reference distance ($d_r$), said electric parameter (P) being associated to a frequency value comprised either into said middle interval ($F_1$) or into one of said lateral intervals ($F_2$, $F_3$) to promote the switching of said at least one electric circuit (S, S').

2. The electronic safety device as claimed in claim 1, wherein said control and switching system (4) comprises a slave electronic circuit (6) connected to said master electronic circuit (5) and adapted to vary said first output signal ($S_{OUT}$) in function of said control signal ($S_C$).

3. The electronic safety device as claimed in claim 1, wherein said control signal ($S_C$) has a substantially constant repetition frequency ($f_C$).

4. The electronic safety device as claimed in claim 2, wherein said slave electronic circuit (6) comprises a programmable area (19) adapted to define a numerical filtering unit that analyzes the frequency spectrum of said control signal ($S_C$) and generates said at least one variable electric parameter (P).

5. The electronic safety device as claimed in claim 4, wherein said numerical filtering unit has a fixed or variable bandwidth (W) substantially centered with respect of said repetition frequency ($f_C$) of said control signal ($S_C$).

6. The electronic safety device as claimed in any claim 1, wherein said transceiver device (3) is adapted to process said return signal ($S_{RX}$) for generating an identification signal ($S_{ID}$) comprising said identification code ($I_{ID}$) of said transponder (2).

7. The electronic safety device as claimed in claim 6, wherein said master electronic circuit (5) has at least one first (11) and one second input (12) connected to said transceiver device (3) to receive respectively said control signal ($S_C$) and said identification signal ($S_{ID}$) and at least one first output (13) for said first output signal ($S_{OUT}$).

8. The electronic safety device as claimed in any claim 2, wherein said slave electronic circuit (6) comprises at least one third input (16) connected to said transceiver device (3) to receive said control signal ($S_C$) and at least one second output (17) for a second output signal ($S'_{OUT}$).

9. The electronic safety device as claimed in claim 2, wherein said master electronic circuit (5) comprises a memory area (14) for memorizing at least one reference code ($I_{DREF}$) and a first microprocessor processing unit (15) adapted to compare said identification code ($I_{ID}$) with said at least one reference code ($I_{DREF}$) and to detect said control signal ($S_C$) for generating a first activation signal ($S_{1A}$) to be sent to said slave electronic circuit (6).

10. The electronic safety device as claimed in claim 9, wherein said slave electronic circuit (6) is adapted to generate a second activation signal ($S_{2A}$) in function of said at least one electric parameter (P) and to send said second activation signal ($S_{2A}$) to said master electronic circuit (5).

11. The electronic safety device as claimed in claim 10, wherein said master electronic circuit (5) is adapted to generate said first output signal ($S_{OUT}$) in function of said second activation signal ($S_{2A}$) and said slave electronic circuit (6) is adapted to generate said second output signal ($S'_{OUT}$) in function of said first activation signal ($S_{1A}$).

12. The electronic safety device as claimed in any claim 8, wherein said control and switching system (4) comprises a first (20) and a second semiconductor switch (21) connected respectively to said first (13) and said second output (17) of said electronic circuits (5, 6) for receiving respectively said first ($S_{OUT}$) and said second output signal ($S'_{OUT}$), said first and said second semiconductor switch (20, 21) being connectable to one or more electric circuits (S, S') for switching thereof.

13. The electronic safety device as claimed in claim 12, wherein said electronic circuits (5, 6) comprise respective feedback circuits (26, 27) associated to the corresponding semiconductor switch (20, 21) to control operation thereof.

* * * * *